US008421544B2

(12) United States Patent
Saraswat et al.

(10) Patent No.: US 8,421,544 B2
(45) Date of Patent: Apr. 16, 2013

(54) CHAOTIC WIDE BAND FREQUENCY MODULATOR FOR NOISE REDUCTION

(75) Inventors: Ruchir Saraswat, Swindon (GB);
Andriy Gelman, Kidderminster (GB);
Ulrich Bretthauer, Braunschweig (DE);
Sunil Parmar, Gandhinagar (IN);
Rajashekar Manche, Bangalore (IN);
Chodimella Venkata Ramana, Murugeshpalya (IN); Shivraj G. Dharne, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 547 days.

(21) Appl. No.: 12/631,281

(22) Filed: Dec. 4, 2009

(65) Prior Publication Data

US 2011/0135027 A1    Jun. 9, 2011

(51) Int. Cl.
*H03B 29/00*    (2006.01)
(52) U.S. Cl.
USPC .............. 331/78; 331/16; 331/34; 375/130; 327/156
(58) Field of Classification Search ............ 331/78, 331/16, 34; 375/130; 327/156
See application file for complete search history.

(56) References Cited

U.S. PATENT DOCUMENTS

| 5,263,055 A | 11/1993 | Cahill |
| 5,506,545 A | 4/1996 | Andrea |
| 5,699,005 A | 12/1997 | Menkhoff et al. |
| 5,943,382 A | 8/1999 | Li et al. |
| 6,687,319 B1 * | 2/2004 | Perino et al. ............ 375/367 |
| 2009/0016413 A1 | 1/2009 | Shen et al. |

OTHER PUBLICATIONS

Pareschi, Fabio, et al., "A 3 GHz Spread Spectrum Clock Generator for SATA Applications Using Chaotic PAM Modulation", Custom Integrated Circuits Conference, 2008. CICC 2008. IEEE Sep. 21-24, 2008, pp. 451-454.
Callegari, Sergio , et al., "Spectral Properties of Chaos-Based FM Signals: Theory and Simulation Results", *IEEE Transactions on Circuits and Systems—Fundamental Theory and Applications*, vol. 50, No. 1, Jan. 2003, 13 pages.
Dellnitz, Michael , et al., "On the isolated spectrum of the Perron-Frobenius operator", *University of Paderborn*, Dec. 10, 1999, 18 pages.
Search and Examination Report mailed Feb. 25, 2011 for United Kingdom Patent Application No. GB1018348.1.
Non-Final Office Action mailed Jul. 24, 2012 for Japanese Patent Application No. 2010-233718.
De Michele, L. et al., "Chaos-Based High-EMC Spread-Spectrum Clock Generator", Proceedings of the 2005 European Conference on Circuit Theory and Design, Oct. 31, 2005, vol. 1, I/165-I/168.
Non-Final Office Action mailed Nov. 21, 2012 for U.S. Appl. No. 12/770,239.

* cited by examiner

*Primary Examiner* — Arnold Kinkead
(74) *Attorney, Agent, or Firm* — Blakely, Sokoloff, Taylor & Zafman LLP

(57) ABSTRACT

The embodiments of the invention relate to apparatus and method for reducing electromagnetic interference (EMI) and radio frequency interference (RFI) in computer systems via a chaotic wide band frequency modulation. The chaotic noise modulator, in one embodiment, comprises: a master cell to generate a control voltage corresponding to an un-modulated reference signal; and a slave cell having a chaotic signal generator to generate a random noise signal, the slave cell coupled with the master cell and operable to generate a modulated output signal in response to the control voltage.

28 Claims, 12 Drawing Sheets

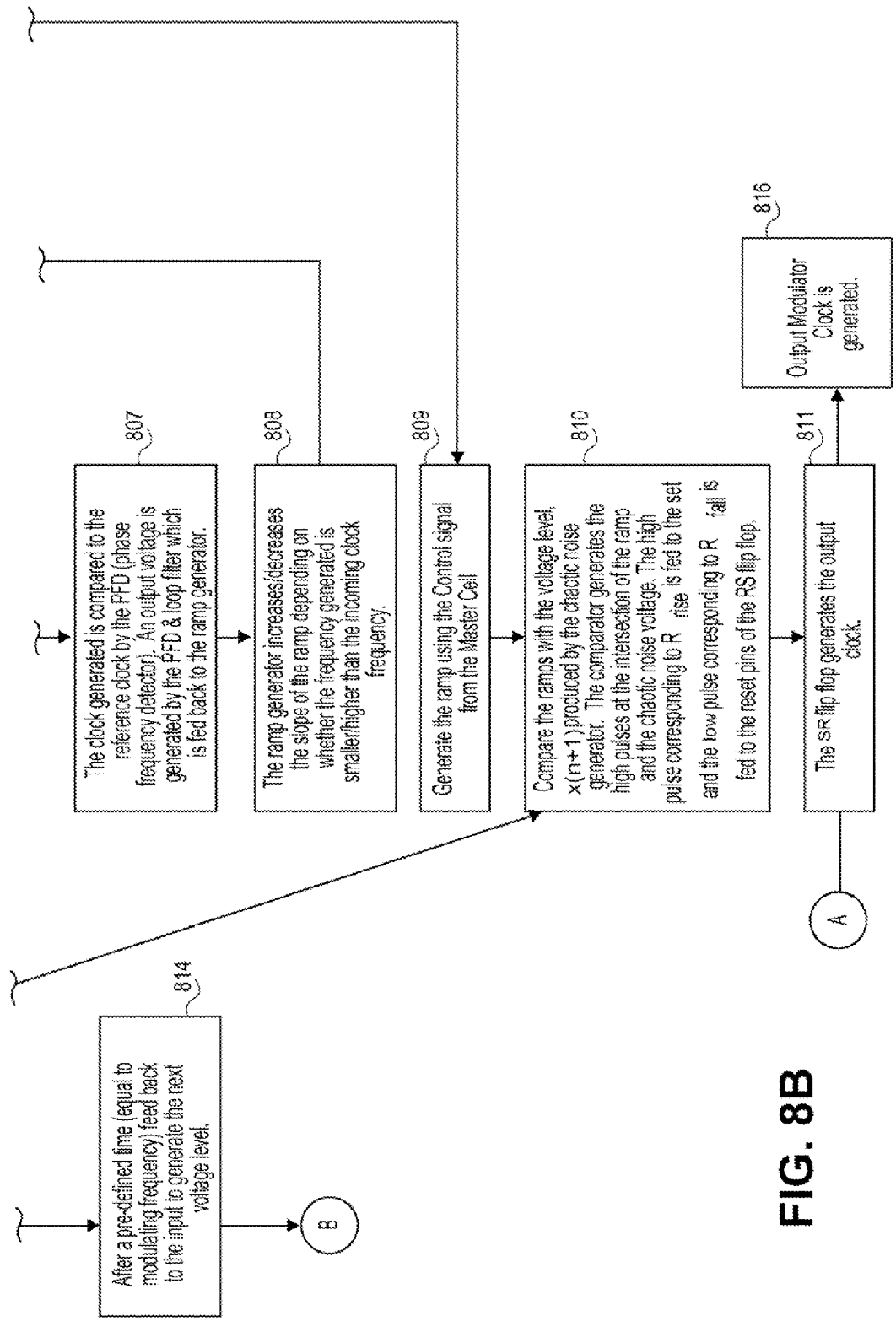

US 8,421,544 B2

CHAOTIC WIDE BAND FREQUENCY MODULATOR FOR NOISE REDUCTION

FIELD OF THE INVENTION

Embodiments of the invention relate generally to the field of noise reduction in a computer system. More particularly, embodiments of the invention relate to apparatus and method for reducing electromagnetic interference (EMI) and radio frequency interference (RFI) in computer systems via a chaotic wide band frequency modulation.

BACKGROUND

As computing devices become more common, the electromagnetic interference (EMI) and radio frequency interference (RFI) caused by one computing device on the operation of another computing device reduces the performance of the other computing device. Such interference may be reduced by special noise reduction casing around the computer devices that deflect any external electromagnetic or radio frequency waves from interfering with the operation and performance of the computer devices. Special paints may also be applied on computing device casings to deflect undesirable electromagnetic or radio frequency signals. Such casings and special paints are expensive and thus not feasible as prices of computing devices reduce.

Noise reduction circuits in computing devices may replace the need for expensive casings and special paints. Traditionally, periodic modulation profiles such as sinusoidal, triangular, and Lexmark profiles have been used to reduce power spectrum peaks generated by processors of a computing device. A lower power peak of the spectrum results in lower EMI interference. Such techniques, however, increase bandwidth of the power spectrum. An increase in bandwidth of the power spectrum may result in interference with neighboring frequency bands causing RFI.

With the inclusion of more and more radios on chip within the free frequency band, multi-radio environment designers face two challenges.

First, the frequency band is becoming more and more clogged with different devices on chip and the surrounding environment. This leads to different devices interacting with each other and causing interference. Such interference can be reduced by shifting the frequency of operation to be away from the interfering channels as shown by FIG. 1. FIG. 1 shows a frequency vs. power plot to illustrate the concept of frequency spreading. To reduce RFI, the operating frequency is shifted as shown by shifting power spectrum 101 to 102. While RFI may be reduced by frequency shifting, the high power peaks of 101 and 102 continue to pose EMI issues.

Second, with increase in frequencies due to abundance of computing devices, reducing EMI to levels specified by regulatory bodies such as the Federal Communications Commission (FCC) is becoming challenging. Traditionally, such challenge is met by spread spectrum techniques that use periodic clock frequency for modulating the power frequency spectrum of a computing device.

The spread spectrum technique increases the bandwidth of the frequency spectrum to decrease the peak power in the spectrum. In FIG. 1, applying spread spectrum technique on the frequency spectrum 105 of a device under test results in a flatter frequency spectrum 104. If a further reduction in peak power is required, a further spread would result in 103. However, reducing the power of 104 to tackle EMI may result in RFI (as shown by 106) due to higher bandwidth of 103. The loss in power to avoid EMI (due to higher power peak) is shown by 105. The higher bandwidth of 103 is caused by enabling a higher spread spectrum technique compared to that applied for 104.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 8A and FIG. 8B are a flowchart showing a process of generating a modulated output signal via the chaotic noise signal, according to one embodiment of the invention.

DETAILED DESCRIPTION

Embodiments of the invention discuss an apparatus and method of for reducing electromagnetic interference (EMI) and radio frequency interference (RFI) in computer systems via a chaotic wide band frequency modulation.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element.

If the specification or claims refer to "an additional" element, that does not preclude there being more than one of the additional element.

As mentioned in the background section, a frequency spread spectrum technique that is based on a periodic clock signal for frequency modulation results in lowering the power peak at the cost of a wider bandwidth of the new power spectrum. This wider bandwidth of the new power spectrum may cause RFI with a neighboring operating frequency spectrum. Applying spread spectrum via pure noise signal that has zero correlation between its consecutive samples is an ideal modulating signal for uniform spreading of the spectrum of the modulated output clock. But generating a purely random signal may be expensive.

Figure 1:
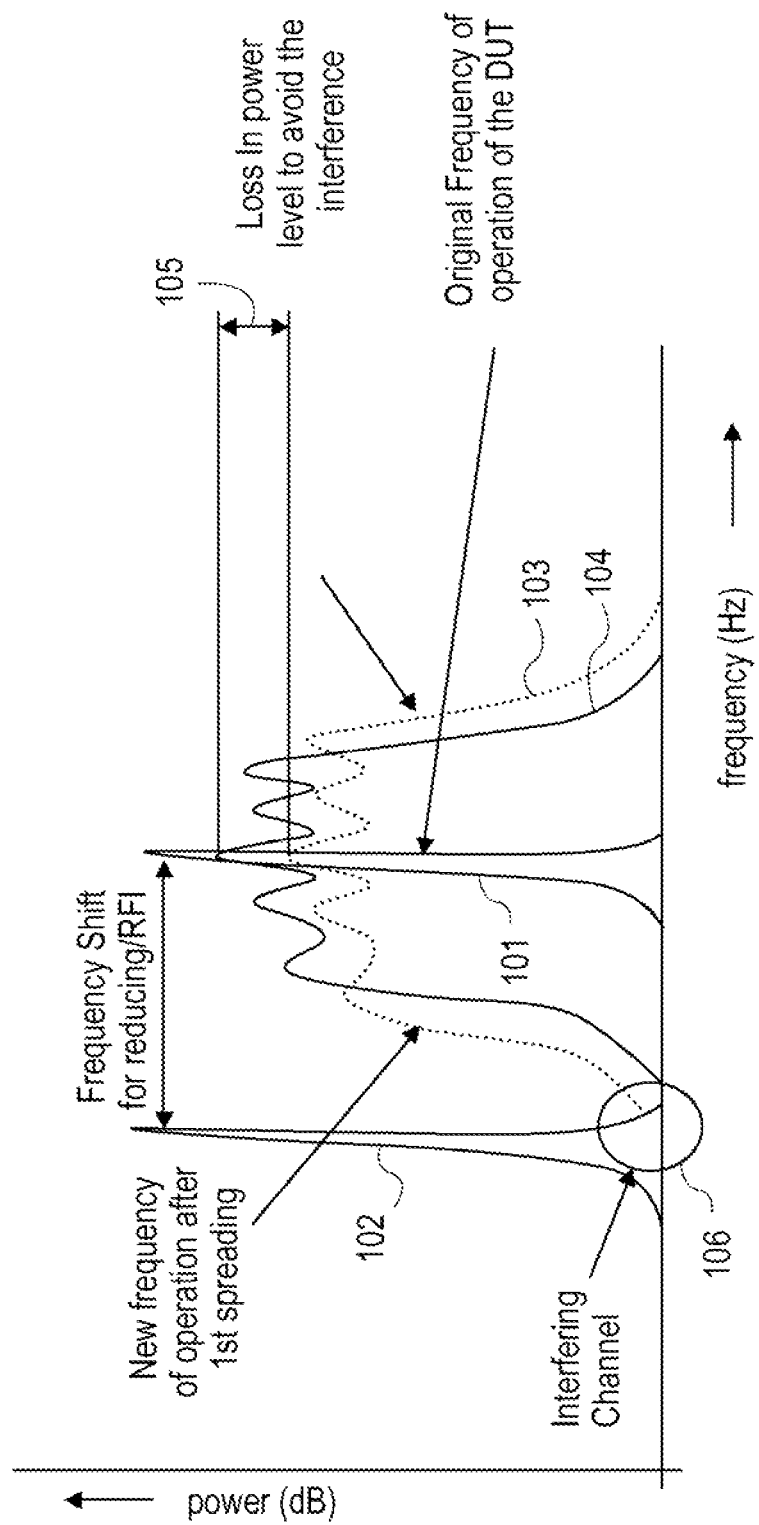
FIG. 1 illustrates the problem of spread spectrum technique for reducing EMI that may cause RFI.
Figure 2:
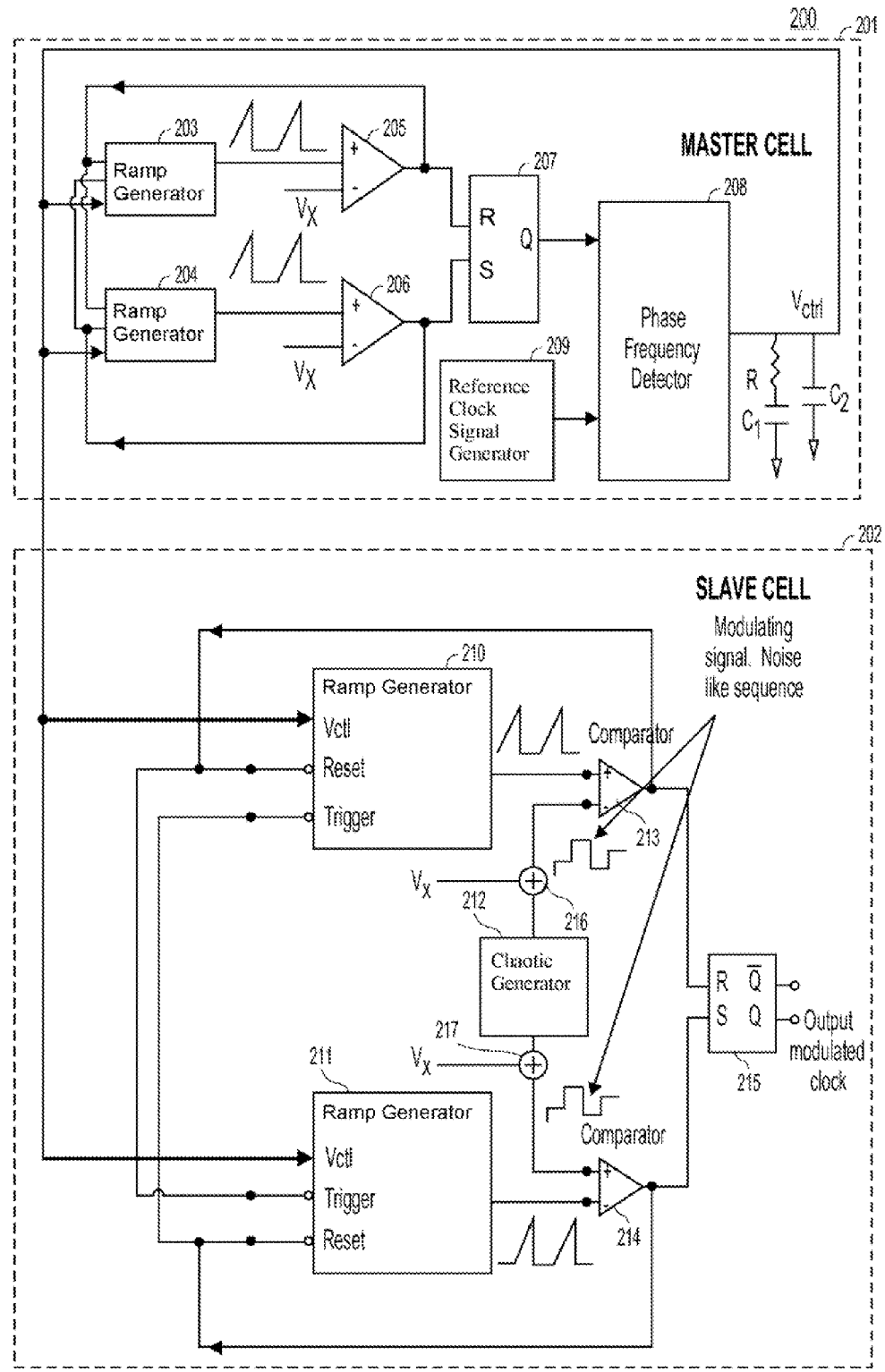
FIG. 2 is a high level block diagram of the master and slave configuration of chaotic wide band frequency modulator, according to one embodiment of the invention.

FIG. 2 illustrates a high level block diagram of a chaotic (random) wide band frequency modulator 200 for EMI and RFI reduction, according to one embodiment of the invention. The modulator 200 is configured as a master 201 and slave 202 cell configuration. Such configuration allows the output modulated clock signal to follow the input un-modulated reference clock signal 209 in case there is any drift the un-modulated reference input clock frequency caused, for example, by clock jitter.

In one embodiment, the master cell 201 comprises a pair of ramp generation circuits 203 and 204 coupled with comparators 205 and 206 respectively. The output of the comparators is connected with an edge generator 207. In one embodiment, the edge generator 207 is a Set-Reset Latch (SR Latch). The comparators 205 and 206 compare the ramp generated periodic signals with a predetermined signal (voltage) $V_x$.

In one embodiment, the predetermined voltage $V_x$ is generated via a band-gap voltage generator circuit. In other embodiments, other voltage sources may be used to generate the predetermined voltage $V_x$. The predetermined voltage $V_x$ is set to a value so that the intersection of the ramp signal and predetermined voltage results in an output frequency which is near (or same) as the un-modulated reference signal frequency. In one embodiment, the predetermined voltage $V_x$ is used to generate control signals for the SR latch 207. The predetermined voltage $V_x$, in one embodiment, is also input to the slave cell which is discussed later.

In one embodiment, the un-modulated reference signal is a periodic signal such as a clock signal generated by a reference clock signal generator 209. In other embodiments, the reference signal is an external signal routed to the phase-frequency detector 208. In one embodiment, the predetermined voltage $V_x$ is a constant signal set at around half the power supply level Vcc/2.

This predetermined voltage $V_x$ is added to the chaotic noise generated by the chaotic noise generator 212 of the slave cell 202 which is discussed later. One purpose for adding the predetermined voltage $V_x$ to the chaotic (random) noise is that if the chaotic noise generator 212 produces zero noise, the output modulated clock of the slave cell 202 is synchronized with the reference clock signal from 209. In one embodiment, the predetermined voltage $V_x$ is added to the chaotic noise signal by adders 216 and 217 of the slave cell 202.

In one embodiment, the phase-frequency detector 208 of the master cell 201 is coupled with the edge generator 207 and the reference clock generator 209. The phase-frequency detector 208 generates a control voltage Vctrl by comparing the output of the edge generator 207 with the un-modulated reference clock signal from 209. The control voltage Vctrl, in one embodiment, is input to the slave cell 202 that generates the final output modulated clock. The control voltage signal Vctrl adjusts the slope of the ramp signal from the ramp generators 203, 204, 210, and 211. The ramp generators 203, 204, 210, and 211 generate ramp signals of the same frequency as the un-modulated input reference clock signal. The purpose of adjusting the slope of the ramp signal is to track any noise (e.g., clock jitter) on the un-modulated input reference clock signal so that the noise is accounted for when generating the modulated output signal.

In one embodiment, the ramp generators 203, 204, 210, and 211 generate ramps for each high and low pulse of the of reference clock signal. The width of the ramps is equal to the high and low pulses of the un-modulated reference input clock signal.

In one embodiment, the loop in the master cell 201 is stabilized by a resistor R and capacitors C1 and C2. The values of the resistor R and capacitors C1 and C2 are 5.5 K Ohms, 15 pF, and 1.5 pF respectively, according to one embodiment of the invention. Other values may be used for other embodiments depending on factors such as process technologies, modulation requirements, etc.

In one embodiment, the slave cell 202 comprises a pair of ramp generators 210 and 211, comparators 213 and 214, a chaotic noise generator 212, adders 216 and 217, and an edge generator 215. The ramp generators 210 and 211 generate the same frequency as the un-modulated reference input clock.

The chaotic signal generator 212 generates a random noise signal. The maximum and minimum values of the noise voltage of the random noise signal depend on the required frequency spread. In one embodiment, the frequency of the random noise signal is low compared to the reference signal frequency. In one embodiment, the frequency of the random noise signal is 32 KHz. The frequency of the reference signal, in one embodiment, is 100 MHz. Other frequencies for the random noise signal and the reference signal may be used for other embodiments without changing the essence of the invention.

The chaotic signal generator 212 is extremely sensitive to initial conditions. This means that a slight change in initial voltage X(n) (also referred as $X_n$) results in different noise profiles. For example, the initial condition of voltage X(n) (also referred as $X_n$) as shown in FIG. 4B when set to 50 mV will generate a completely different noise profile when compared to an initial condition of voltage X(n) set to 55 mV. In this example, a 5 mV change in the initial condition results in completely different noise profiles. This sensitivity to the initial voltage condition of $X_n$ means that the chaotic signal generator 212 is deterministic—for every initial condition a known, but different, noise profile is generated by the chaotic signal generator 212. This behavior of the chaotic signal generator 212 also means that consecutive samples of the chaotic noise signal will have a non-zero correlation between its consecutive samples. As mentioned above, a pure noise signal has a zero correlation between its consecutive samples. The implementation of the chaotic noise generator 212, which is later discussed in reference to FIG. 4A and FIG. 4B, and its performance (as shown by FIG. 5A and FIG. 5B) illustrate that the output of the chaotic signal generator 212 is indeed random (chaotic)—with apparent zero correlation between the chaotic signal samples. The reason for apparent zero correlation between chaotic signal samples from the chaotic signal generator 212 is that the correlation decreases exponentially by the embodiment shown in FIG. 4A, thus resulting in a random (chaotic) output signal.

In one embodiment. the comparators 213 and 214 of the slave cell 202 compare the random noise signal from the chaotic noise generator 212 with the ramp signals from the ramp generators 210 and 211. In one embodiment, the random noise signals from the chaotic noise generator 212 are added (by adders 216 and 217) with the predetermined voltage $V_x$ of the master cell 201. The summed output is then compared with the ramp signals from the ramp generators 210 and 211 by comparators 213 and 214. The output of the comparators 213 and 214 is then input to the edge generator 215. In one embodiment, the edge generator 215 is an SR latch. The output of comparator 213 is input as the "reset" of the SR latch 215 while the output of the comparator 214 is input as "set" of the SR latch 215, according to one embodiment of the invention. In one embodiment, the comparators of the slave cell 202 are identical to comparators of the master cell 201 to track variations in the reference clock signal when generating the modulated clock output.

In one embodiment, the ramp signals generated by the ramp generator 210 correspond to the low pulses of the un-modulated reference clock signal. Likewise, the ramp signals generated by the ramp generator 211, in one embodiment, correspond to the high pulses of the un-modulated reference clock signal. When the ramp signal crosses the random noise signal, the comparators (213 and 214) output transitions from high to low or low to high. As mentioned above, in one embodiment, the random noise signal is summed with the predetermined voltage $V_x$ of the master cell 201 before being compared with the ramp signals by comparators 213 and 214.

In one embodiment, when the output of the comparator 214 transitions from high to low (or low to high), the ramp generator 211 resets. This reset causes the ramp generator to discontinue (discharge) the ramp signal. The same output transition from the comparator 214 also causes the other ramp generator 210 to trigger, i.e. to begin generating a ramp signal. A similar cross coupling of the output of the comparator 213 for resetting the ramp generator 210 and for triggering the other ramp generator 211 is implemented.

In one embodiment, the output of the comparator 214 sets the SR latch 215, i.e. the SR latch 215 generates a high signal. The output of the comparator 213, in one embodiment, resets the SR latch 215, i.e. the SR latch 215 generates a low signal. Consequently, the ramp generator 210 and the comparator 213 generate low pulses of the modulated output clock while the ramp generator 211 and the comparator 214 generate high pulses of the modulated output clock signal.

One purpose of matching the design of the master and slave cells 201 and 202 respectively is, for example, to keep track of any noise on the un-modulated reference clock signal when generating the output modulated signal.

Figure 3:
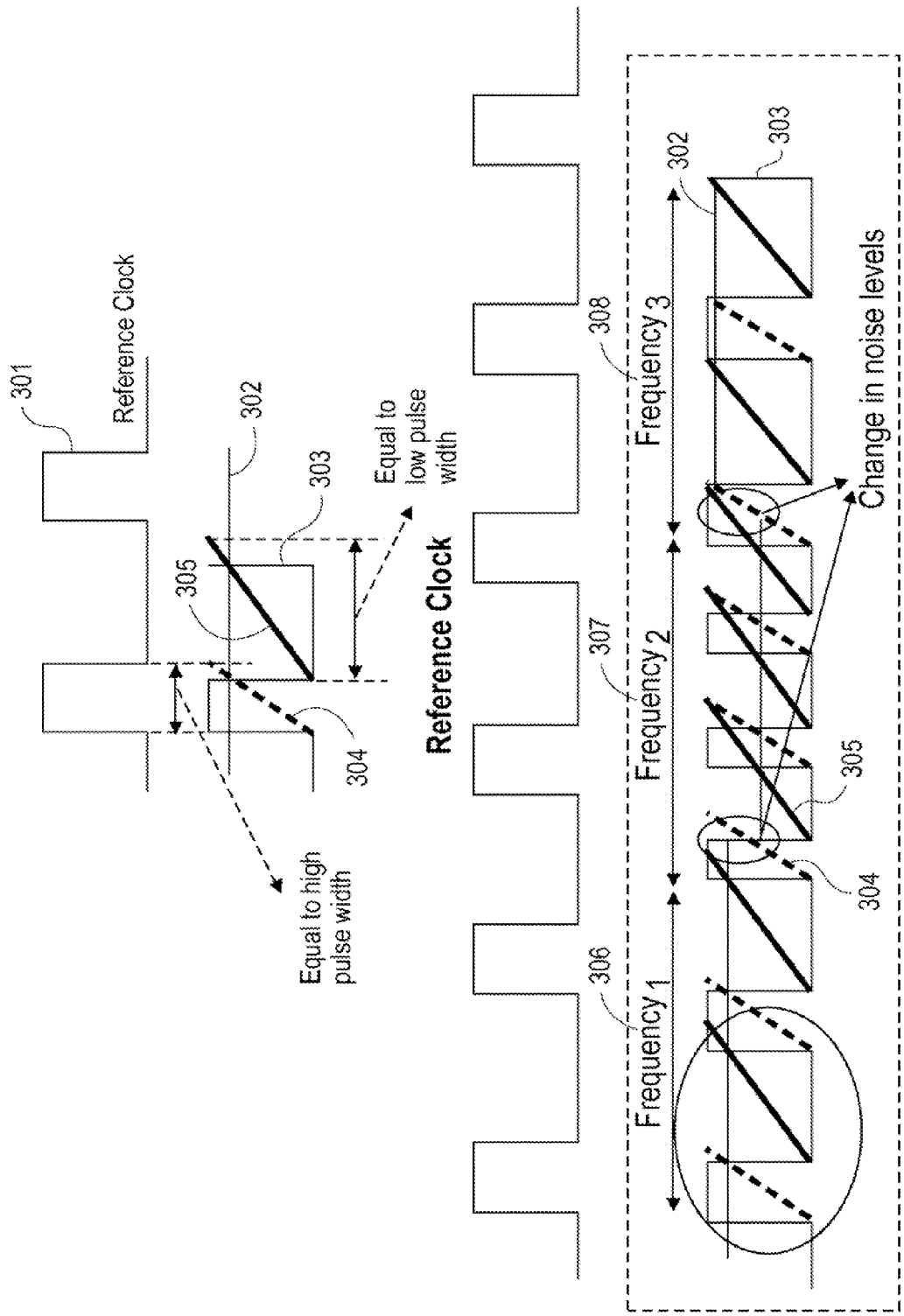
FIG. 3 illustrates the generation of the modulated output signal via a chaotic noise signal, according to one embodiment of the invention.

FIG. 3 illustrates the high level graphical view of the algorithm for generating the modulated output signal via a chaotic (random) noise signal, according to one embodiment of the invention. In one embodiment, two ramps (304 and 305) with width equal to the high and the low pulse of the un-modulated reference clock 301 respectively are generated. These ramp signals (304 and 305) are compared by comparators (213 and 214 from FIG. 2) with the chaotic (random) noise signal 302 to generate the output modulated signal 303. As mentioned above, in one embodiment, the random noise signal 302 is summed with the predetermined voltage $V_x$ of the master cell 201 by adders 216 and 217 of FIG. 2 before being compared with the ramp signals by comparators 213 and 214.

In one embodiment, the frequency of the random noise signal 302 (as shown in FIG. 3) is lower than the reference clock frequency generated by 209 of FIG. 2. When the random noise signal 302 changes in voltage value, the frequency of the modulated output signal changes. This change in frequency is because the ramp signals (304 and 305) intersect the random noise signal 302 at different points than the intersection points before the change in random noise signal voltage level. The change in frequency is shown in FIG. 3 by 306, 307, and 308.

In one embodiment, the voltage levels of the chaotic (random) noise signal 302 depend on the chaotic transfer map. This chaotic transfer map is implemented by the chaotic noise generator 212 of FIG. 2. In one embodiment, a tent transfer map is implemented as the chaotic transfer map. In another embodiment, a Bernoulli shift map is implemented as the chaotic transfer map. Likewise, other embodiments may implement other forms of chaotic transfer map to generate chaotic (random) noise signal 302.

Figure 4A:
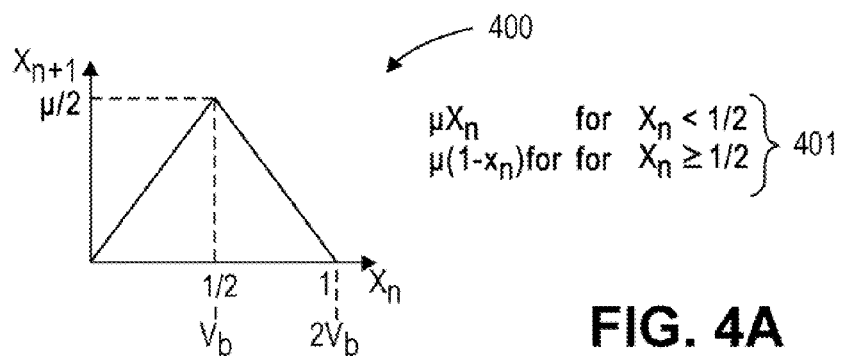
FIG. 4A illustrates a chaotic transfer map according to one embodiment of the invention.
Figure 4B:
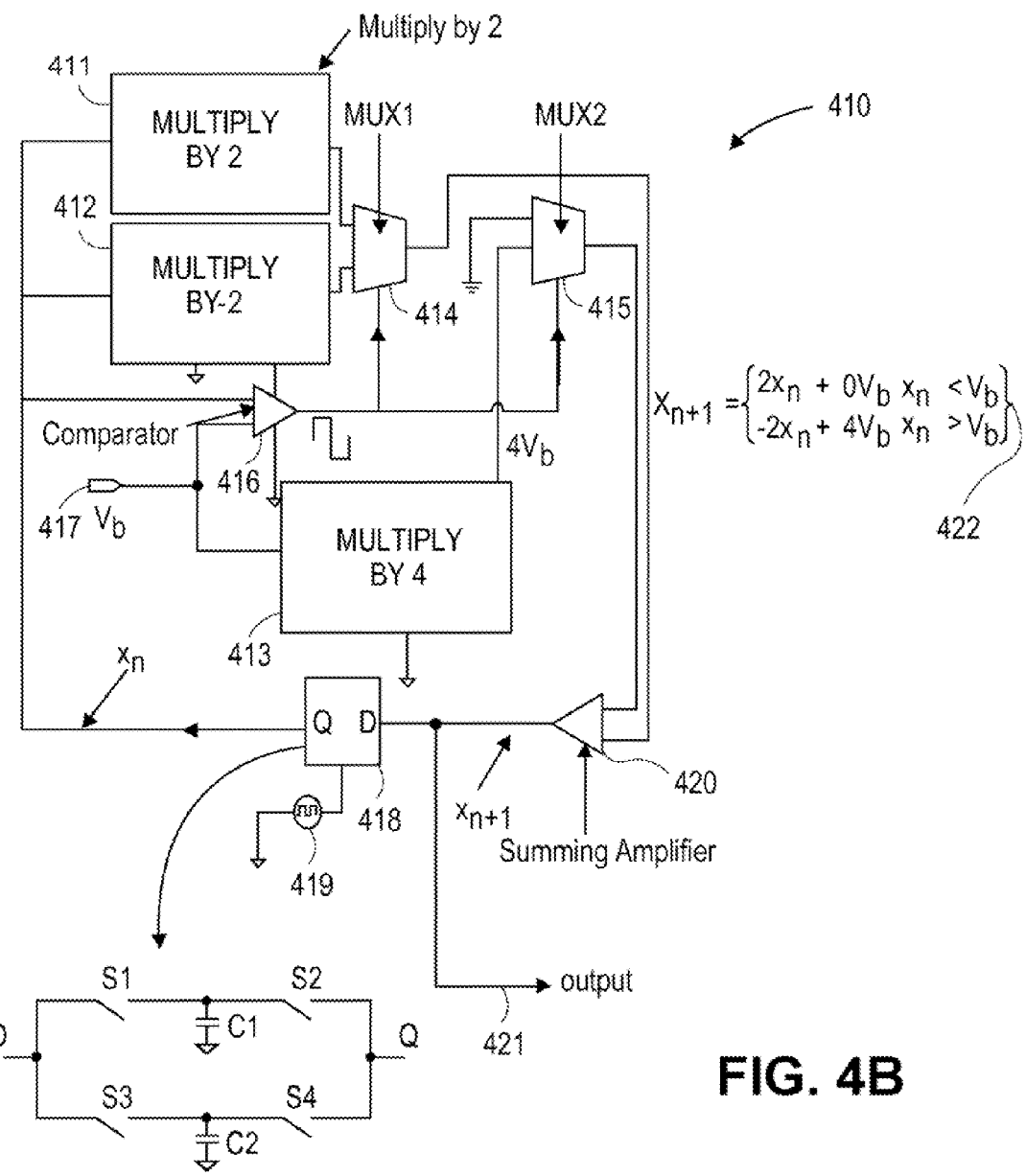
FIG. 4B illustrates an implementation of a chaotic noise generator according to one embodiment of the invention.
Figure 5A:
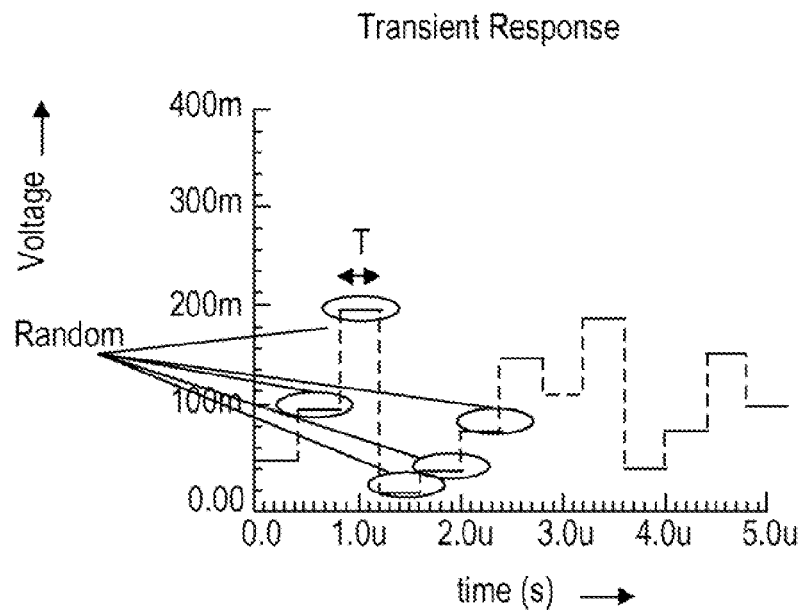
FIG. 5A illustrates the output of the chaotic noise generator of FIG. 4B that implements a tent map as the chaotic transfer map function, according to one embodiment of the invention.
Figure 5B:
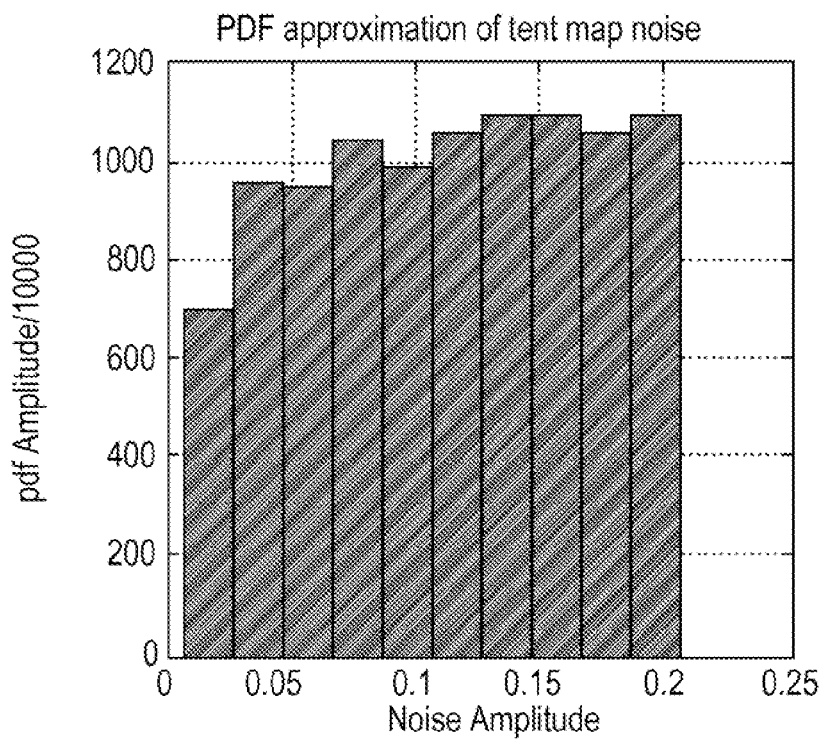
FIG. 5B illustrates the probability density function (PDF) of the tent map noise via the chaotic noise generator of FIG. 4B, according to one embodiment of the invention.

FIG. 4A illustrates a chaotic transfer map which is a tent map 400, according to one embodiment of the invention. One advantage of a tent map is that the transfer function has only two quadrants and therefore makes the implementation simple. The tent map 400 is described by a typical tent map equation 401. In one embodiment, the tent map 400 is implemented with $\mu=2$. In other embodiments, other values of $\mu$ may be used without changing the principal of operation of the chaotic noise generator 212 of FIG. 2. Referring back to FIG. 4A, the x-axis is $X_n$ voltage while the y-axis is $X_{(n+1)}$ voltage. In one embodiment, the bias voltage $V_b$ (discussed in FIG. 4B) is set to the halfway point of the triangular map signal. The implementation of the multiplying circuits, discussed in FIG. 4B, depends on what the bias voltage $V_b$ is set relative to $X_n$.

FIG. 4B illustrates an implementation of a chaotic noise generator 410 according to one embodiment of the invention. The implementation discussed here uses the tent map (400 of FIG. 4A) as the chaotic transfer map. In one embodiment, multipliers 411, 412, and 413 are analog multipliers. These multipliers, in one embodiment, are implemented as OPAMP (operational amplifiers) based circuits. The resistors (not shown) in the multipliers determine the multiplying factors of the multipliers 411, 412, and 413. In the implementation of FIG. 4B, the multiplying factors of the multipliers are based on the tent map equation 422. Therefore, multiplier 411 is a multiply by 2, multiplier 412 is a multiply by −2, and multiplier 413 is a multiply by 4, according to one embodiment of the invention.

In one embodiment, multiplier 411 multiplies a previous random noise signal $X_n$ by 2 to generate $2X_n$, multiplier 412 multiplies the previous random noise signal $X_n$ by −2 to generate $-2X_n$, and multiplier 413 multiplies the bias voltage $V_b$ 417 by 4 to generate $4V_b$.

Multiplexer 414 is configured to select either $2X_n$ or $-2X_n$ signals while multiplexer 415 is configured to either pass a ground signal (a zero) or $4V_b$ to the summing amplifier 420, according to one embodiment of the invention. In one embodiment, depending on the voltage of the signal $X_n$, the comparator 416 selects the appropriate control signals of the multiplexers 411 and 412. The output of the summing amplifier 420 is $X_{(n+1)}$ which is the output of the tent map equation and is also the random noise signal 421 that is input to the comparators 213 and 214 of FIG. 2. As mentioned above, in one embodiment, the random noise signal 421 is summed with the predetermined voltage $V_x$ of the master cell 201 before being compared with the ramp signals by comparators 213 and 214.

The output 421 of the summing amplifier 420 is sampled by an analog flip-flop 418. The sampling frequency of the analog flip-flop 418 is controlled by a clock signal 419. In one embodiment, the analog flip-flop 418 is implemented with switches S1-S4 and capacitors C1-C2. In one embodiment, these switches are implemented as transistors. The switches operate out of phase with one another to connect the input node with one of the capacitors while the other capacitor samples the new value. In one embodiment, the output Q of the analog flip-flop 418 is connected with a high impedance terminal to prevent the output capacitor from discharging. In one embodiment, the input D of the analog flip-flop 418 is connected with a low impedance terminal to allow the input capacitor to be charged. In one embodiment, the analog flip-flop is operable to sample the random noise signal at a programmable sampling frequency. The sampling frequency, in one embodiment, may be programmed by hardware or software or both.

In one embodiment, the bias voltage $V_b$ 417 is generated on-chip or off-chip. In one embodiment, the bias voltage $V_b$ 417 is generated by a band-gap circuit (not shown). The value of the $V_b$, 417, in one embodiment, is 105 mV. The bias voltage $V_b$ 417 is also used to program the spread of the frequency spectrum. This programming, in one embodiment, is implemented by software or hardware or both. Changing the bias voltage $V_b$ 417 changes the noise voltage level $X_n$ which intern changes the output frequency (spread of the frequency spectrum) of the modulated output clock.

FIG. 5A illustrates the output of the chaotic noise generator of FIG. 4B that implements a tent map as the chaotic transfer map function, according to one embodiment of the invention. The plot illustrates that random noise signal levels are random over time because they do not follow any particular pattern i.e. zero correlation between noise samples.

FIG. 5B illustrates the probability density function (PDF) of the tent map noise via the chaotic noise generator of FIG. 4B, according to one embodiment of the invention. After initial settling time of the circuits of the chaotic noise generator of FIG. 4B, the PDF is quite uniform and is comparable to white noise.

Figure 6A:
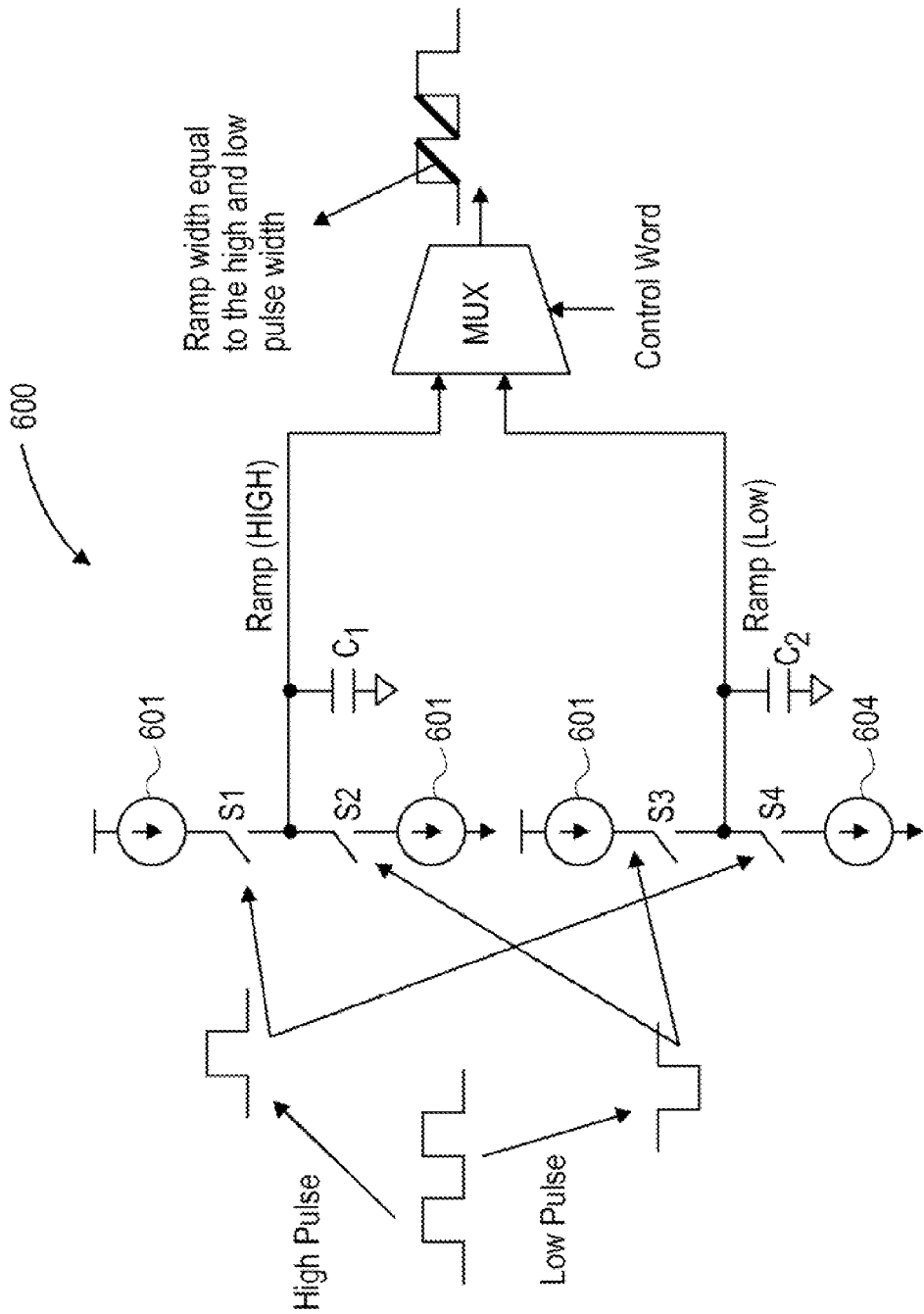
FIG. 6A illustrates a high level block diagram of a ramp generator 600, according to one embodiment of the invention.

FIG. 6A illustrates a high level block diagram of a ramp generator 600, according to one embodiment of the invention. Current sources 601-604 are configured to source and sink current to and from capacitors C1 and C2. In one embodiment, high pulses of the reference clock signal control switches S1 and S4, while low pulses of the un-modulated reference clock signal control switches S2 and S3, respectively. Such a control mechanism generates a high ramp signal and a low ramp signal with widths equal to the high and low pulses of the un-modulated reference clock signal. These high and low ramp signals are input to the multiplexer 605 which is controlled by the outputs of the comparator 213 and 214 of FIG. 2. In one embodiment, the current sources 601 and 602, the switches S1 and S2, and the capacitor C1 collectively represent a first charge pump of the ramp generator 600. Similarly, in one embodiment, the current sources 603 and 604, the switches S3 and S4, and the capacitor C2 collectively represent a second charge pump of the ramp generator 600.

In one embodiment, the ramp signals are reset, i.e. the ramp is discontinued or discharged, when the ramp generator receives a reset signal from comparators 213 and 214 of FIG. 2. In one embodiment, the ramp signals begin to ramp upon a trigger signal also set by the comparators 213 and 214 of FIG. 2.

Figure 6B:
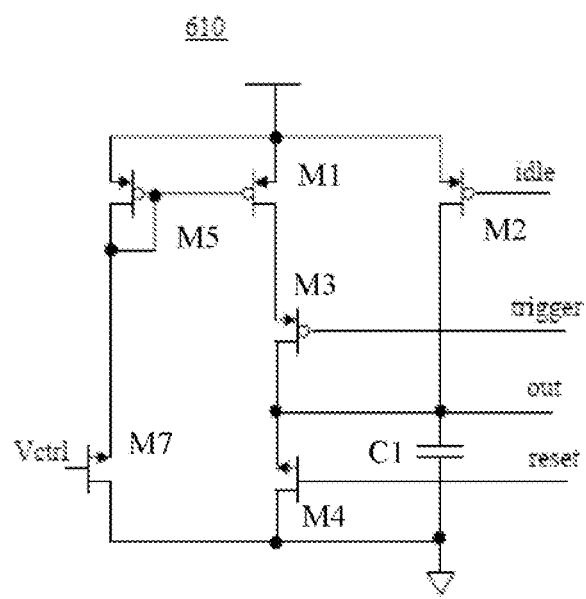
FIG. 6B illustrates a transistor level implementation of the ramp generator (210 and 211 of FIG. 2), according to one embodiment of the invention.

FIG. 6B illustrates a transistor level implementation 610 of the ramp generator (203, 204, 210 and 211 of FIG. 2), according to one embodiment of the invention. The control signal Vctrl from the master cell 201 controls the charging of capacitor C1, thus controls the gradient of the ramp. The PMOS transistors M5 and M1 form a current mirror. In one embodiment, when the trigger signal and the reset signal are low, i.e. at ground level, capacitor C1 is charged. In another embodiment, when the trigger signal (connected to PMOS transistor M3) and the reset signal are high, i.e. at supply level, capacitor C1 is discharged. Since the current through the NMOS transistor M4 is not controlled, the discharge current quickly discharges capacitor C1. One purpose of not controlling the NMOS transistor M4, which results in quick discharge of the ramp signal output (out), is to provide ample time to charge the output (out) again on the next reference clock cycle.

Figure 6C:
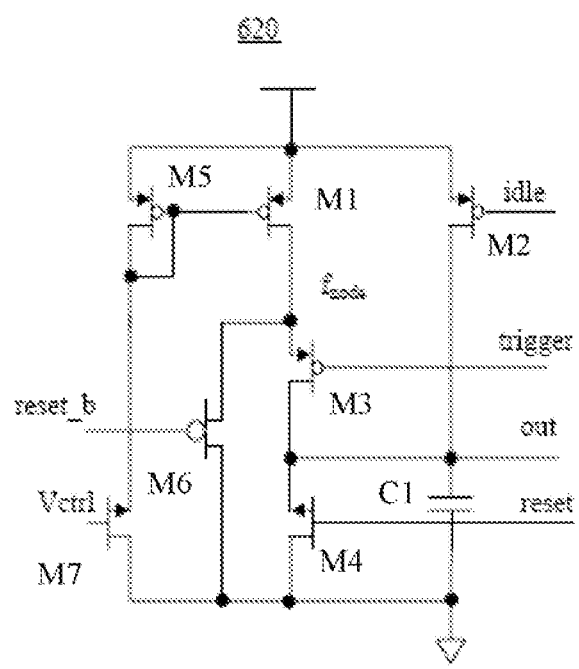
FIG. 6C illustrates a transistor level implementation of the ramp generator (210 and 211 of FIG. 2), according to another embodiment of the invention.

FIG. 6C illustrates a transistor level implementation 620 of the ramp generator (203, 204, 210 and 211 of FIG. 2), according to another embodiment of the invention. In this embodiment, as compared with the embodiment of FIG. 6B, the addition of the PMOS transistor M6 pulls down the floating node, $f_{node}$, to ground when the reset_b signal is enabled, i.e. the ramp is being discontinued or discharged. In such an embodiment, the ramp characteristic of the ramp signal is more controlled than the ramp characteristic of the ramp signal generated by FIG. 6B because the node, $f_{node}$, is not in a floating state when the charging of the ramp starts, i.e. when the trigger signal and the reset signal are low.

In one embodiment, the signal "idle" which is input to the PMOS transistors M2 of FIG. 6B and FIG. 6C, is used to bypass the ramp generator 610 and 620. When the "idle" signal is set to zero (ground), the "out" node is pulled up to the power supply level thus eliminating the effect of the floating node, $f_{node}$. While the embodiments of FIG. 6B and FIG. 6C are shown as a CMOS based design, other transistor technologies (e.g., ECL, BJT, BiCMOS, etc.) may be used to implement the same design without changing the essence of the invention.

Figure 7:
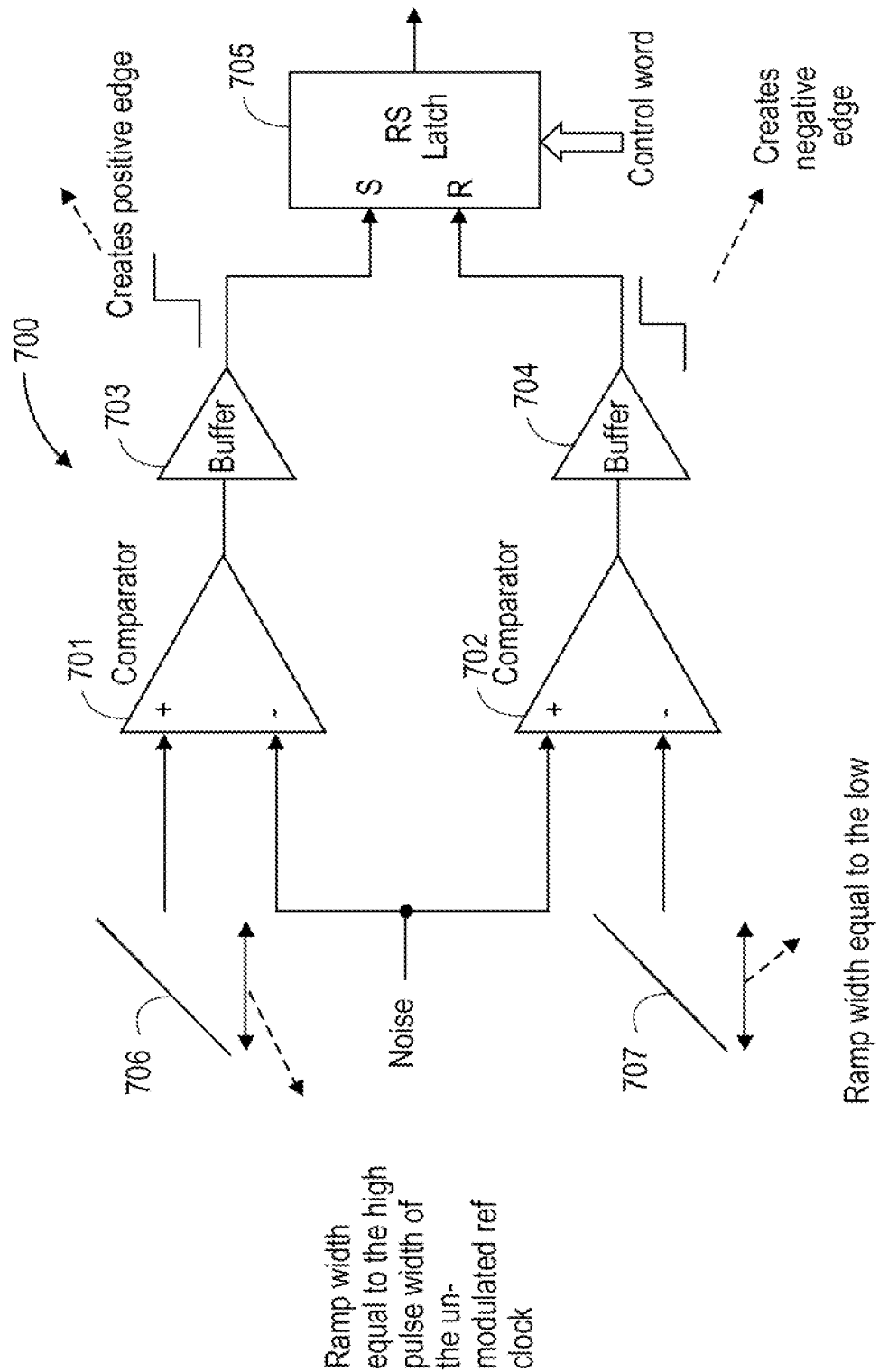
FIG. 7 illustrates a high level implementation of the edge generator, according to one embodiment of the invention.

FIG. 7 illustrates a high level implementation of the edge generator 700, according to one embodiment of the invention. As mentioned above, the edges of the output signal for both the master cell 201 (signal input to the phase-frequency detector 208 of FIG. 2) and the slave cell 202 (output modulated signal) of FIG. 2 are generated by 207 and 215. While blocks 207 and 215 generate the final edges, the edge generation architecture includes comparators 701 and 702 (same as comparators 205, 206, 213, and 214 of FIG. 2) to engage the blocks 207 and 215. In one embodiment, comparators 701 (same as 205 and 213 of FIG. 2) and 702 (same as 206 and 214 of FIG. 2) receive the random noise signal and the ramp signals 706 and 707 to generate positive and negative edges for the modulated output signal. As mentioned above, in one embodiment, the random noise signal is summed with the predetermined voltage $V_x$ of the master cell 201 before being compared with the ramp signals 706 and 707 by comparators 701 and 702.

In one embodiment, the width of the ramp signals is equal to the width of the high and low pulses of the un-modulated reference clock signal. The output of the comparators, in one embodiment, is buffered by buffers 703 and 704 to strengthen the signal strength of the comparator output. The comparators, in one embodiment, are implemented as differential amplifiers. The output of the buffers 703 and 704, in one embodiment, is input to the edge generating circuit 705. The edge generator 705, in one embodiment, is an SR latch.

In one embodiment, when the ramp-high signal 706 is equal to the random (chaotic) noise signal, comparator 701 sets the SR latch 705. Similarly, in one embodiment when the ramp-low signal 707 is equal to the random (chaotic) noise signal, the comparator 702 resets the SR latch 705. As mentioned above, in one embodiment, the random noise signal is summed with the predetermined voltage $V_x$ of the master cell 201 before being compared with the ramp signals 706 and 707 by comparators 701 and 702 to generate the reset and set signals for the SR latch 705.

Referring back to FIG. 2 in view of FIG. 7, the master cell 201 implements a similar ramp generator and edge generator as that of slave cell 202. Such master-slave configuration compensates any comparator offset induced error (of comparators 213 and 214) in the slave cell 201 by the control signal Vctrl that is generated via the identical comparators (205 and 206) in the master cell 201.

Figure 8A:
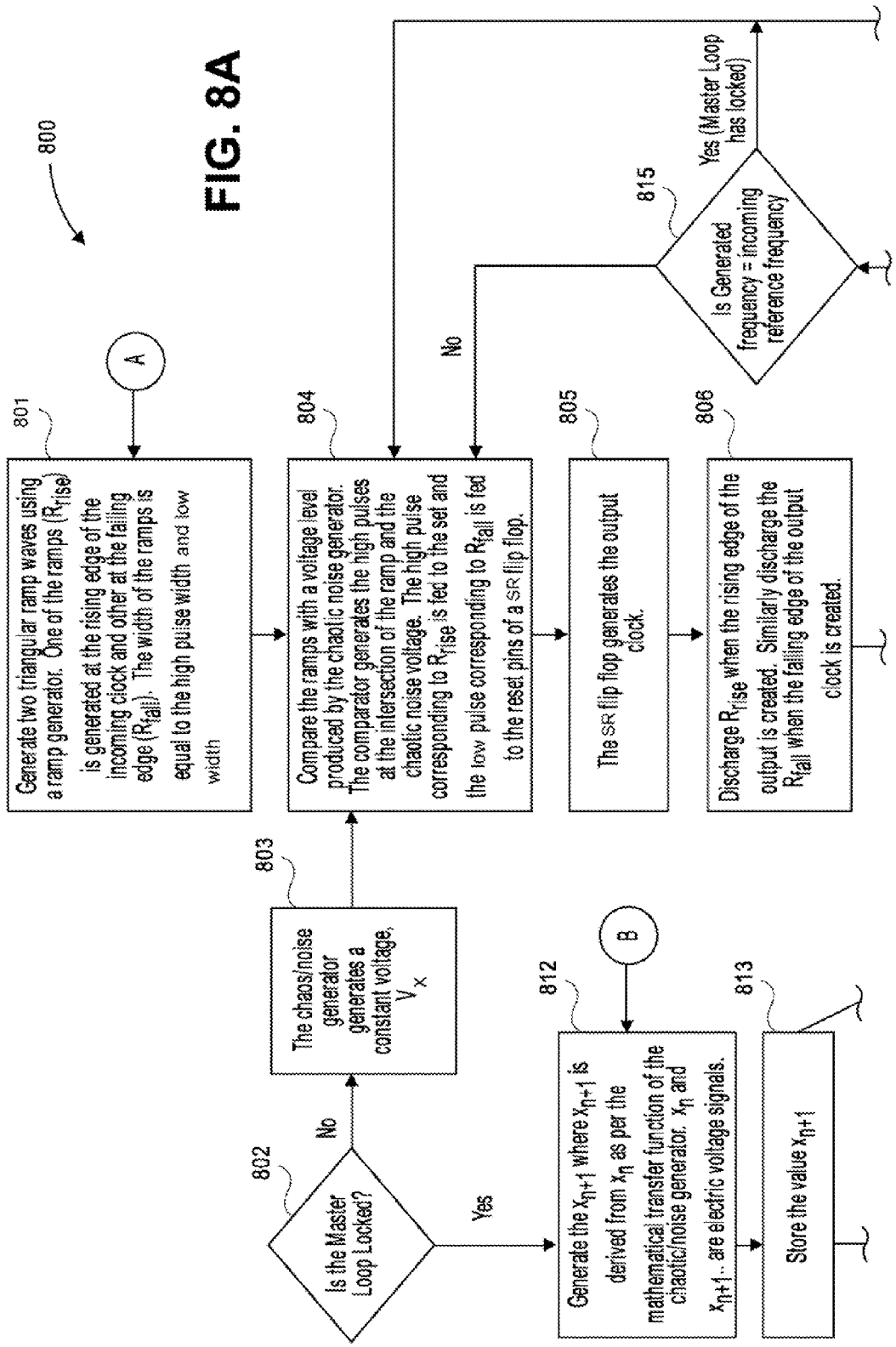

FIG. 8A and FIG. 8B is a flow chart 800 showing a process of generating a modulated output signal via the chaotic noise signal, according to one embodiment of the invention. The process is described with reference to FIG. 2 and FIG. 4B. At block 801, two triangular ramp signals are generated via the ramp generator 203-204 and 210-211. As mentioned above, regarding the generation of ramp signals, one of the ramps ramp-high ($R_{rise}$) is generated at the rising edge of the incoming un-modulated reference clock signal and ramp-low ($R_{fall}$) is generated at the falling edge of the un-modulated reference clock signal.

At block 802, a determination is made about phase locking of the master cell 201, according to one embodiment of the invention. In one embodiment, if the master cell 201 is not locked, then block 803 is executed. At block 803, the chaotic noise generator 212 generates a constant voltage $V_x$ by-passing the output 421 of FIG. 4B via a multiplexer (not shown in FIG. 4B). This constant voltage $V_x$ is the same predetermined voltage $V_x$ from the master cell 201. In one embodiment, the adders 216 and 217 are by-passed because the chaotic noise generator 212 itself outputs $V_x$ by-passing the output signal 421 of FIG. 4B, and so there is no need to add $V_x$ again by adders 216 and 217. In another embodiment, block 803 generates a zero output by the chaotic noise generator 212, and therefore the adders 216 and 217 are not by-passed. In either embodiment, when the master cell 201 is not locked, the comparators 213 and 214 compare $V_x$ with the outputs of the ramp generators 210 and 211. In yet another embodiment, $V_x$ is not added to the chaotic noise generator 212 or by adders 216 and 217 before the chaotic noise generator output 421 is compared by comparators 213 and 214.

If the master cell 201 is locked, then at blocks 812-813, $X_{(n+1)}$ signal from the chaotic noise generator 212, which is derived from $X_n$, is stored by the analog flip-flop 418. At block 814, after a predetermined sampling time, $X_{(n+1)}$ is input back (as $X_n$) to the comparator 416 of FIG. 4B, according to one embodiment of the invention. This process, in one embodiment, is repeated as shown by indicator B of FIG. 8A and FIG. 8B. The chaotic noise signal $X_{(n+1)}$ is also used by block 810 which is discussed later.

At block 804, the output of the chaotic noise generator 212 and the output of the ramp generators 203 and 203 are input to comparators 205 and 206 of the master cell, according to one embodiment of the invention. The comparators 205 and 206 compare the ramp signals with the pre-determined voltage level $V_x$. The comparators 205 and 206 generate high pulses at the intersection of the ramp signals and the predetermined voltage signal. The high pulse from comparator 205 is input as "set" signal to the SR latch 207 while the low pulse from the comparator 206 is input as "reset" signal to the SR latch 207, according to one embodiment of the invention.

At block 805, the SR latch 207 generates an output clock which is used as feedback clock for the phase-frequency detector 208, according to one embodiment of the invention. In one embodiment, at block 806, the ramp signals are discharged to ground when rising and falling edges of the output modulated clock are generated. In another embodiment, the output of the comparators 205 and 206 are used to discharge the ramp signals for high and low reference clock signal.

In one embodiment, at block 807, the clock generated by the SR latch 207 is compared with the reference clock signal by the phase-frequency detector 208. The output of the phase-frequency detector 208 is filtered by an RC network resulting in a control voltage Vctrl which is input to the ramp generators 203 and 204. In one embodiment, the ramp generators 203 and 204 of the master cell 201 are identical to the ramp generators 210 and 211 of the slave cell 202.

In one embodiment, at block 808, the ramp generators 210 and 211 of the slave cell 202 adjust the slope of the ramp signals by increasing or decreasing the slope in view of the Vctrl signal from the master cell 201. The adjustment of the slope depends on the frequencies of the periodic ramp signals when compared to the un-modulated reference clock signal. The adjustment of the slopes results in a final ramp signal, which is generated at block 809.

In one embodiment, at block 815, a determination is made regarding the locked status of the loop in the master cell 201. If the master cell 201 is locked, then the control voltage Vctrl is stable enough for the slave cell 202 to perform its function properly. This means that the chaotic noise output 421 of FIG. 4B is used by comparators 213 and 214 of FIG. 2. As mentioned above, in one embodiment, the random noise signal 421 of FIG. 4B is summed with the predetermined voltage $V_x$ of the master cell 201 before being compared with the ramp signals by comparators 213 and 214. If the master cell 201 is unlocked because the frequency of the ramp signals is not same as the frequency of the un-modulated input reference signal, then block 804 is repeated. At this point the comparators 213 and 214 compare $V_x$ with the ramp signals because the output 421 of the chaotic noise generator 212 is by-passed.

In one embodiment, at block 810, the output 421 of the chaotic noise generator 212 that generates a random noise signal $X_{(n+1)}$ is added by adders 216 and 217 with the predetermined voltage $V_x$. The summed output is then compared with the ramp signals generated by ramp generators 210 and 211 of the slave cell 202. This comparison is performed by comparators 213 and 214. In one embodiment, the output of the chaotic noise generator 212 is directly input to the comparators 213 and 214. The output of the comparators 213 and 214, of the slave cell 202, are input as "set" and "reset" signals to the SR latch 215, according to one embodiment of the invention. At block 811, the SR latch 215 generates the output modulated clock. At that point, the process is repeated from block 801 as represented by the indicator 'A.' When several cycles of the output modulated clock are generated, then at block 816 a declaration is made that a modulated output clock is generated from the chaotic noise signal.

Figure 9:
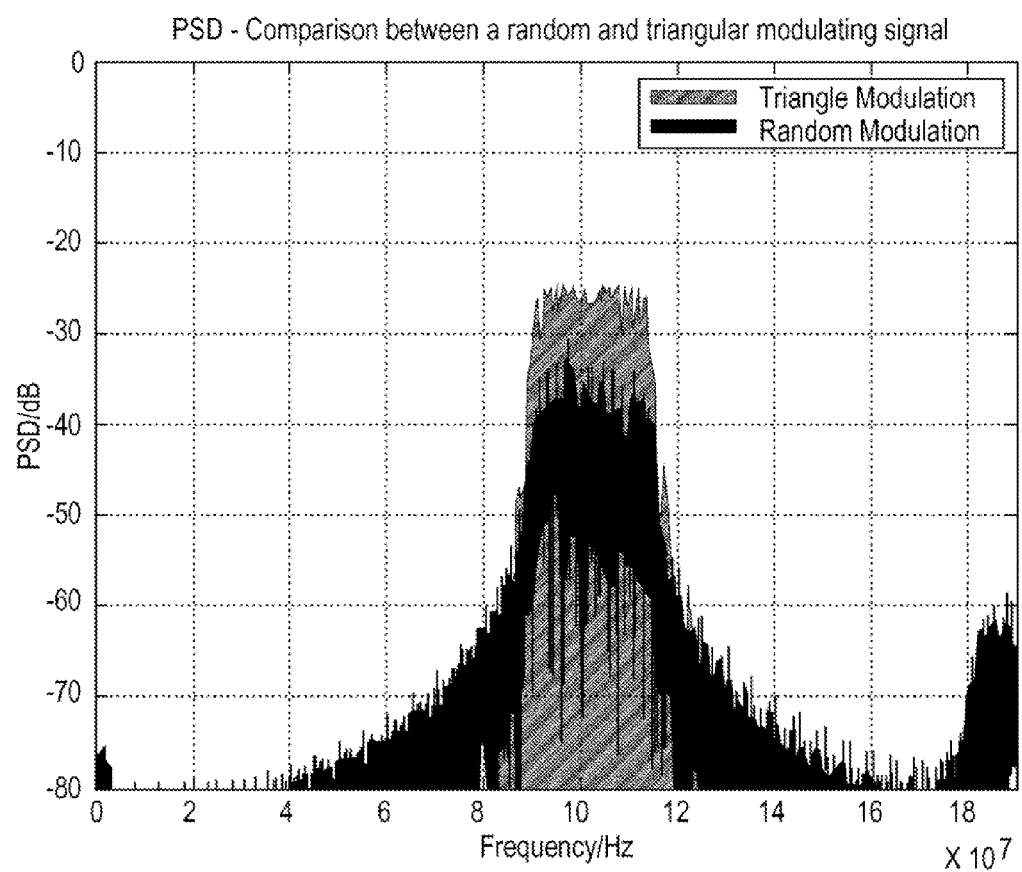
FIG. 9 illustrates the benefit of chaotic noise based modulation over periodic triangular signal based modulation, according to one embodiment of the invention.

FIG. 9 illustrates the benefit of chaotic noise based modulation over periodic triangular signal based modulation, according to one embodiment of the invention. The plot of FIG. 9 is a frequency spread spectrum. The shaded gray spectrum represents the spectrum from modulating the clock signal via a periodic triangle signal, while the black spectrum represents the spectrum from modulating the clock signal via the chaotic noise, according to the embodiments described herein. The black colored spectrum has a lower power peak than the shaded gray spectrum, by 12 dB in this example. This means that chaotic noise based modulation lowers the EMI noise by 12 dB over the triangular based modulation. At the same time, the bandwidth of both the shaded gray spectrum and the black spectrum remains the same. This means that RFI can be reduced using the black spectrum by trading off power peak with bandwidth.

Elements of embodiments are also provided as a machine-readable storage medium for storing the computer-executable instructions. For example, in one embodiment, the bias voltage $V_b$ of FIG. 4B is programmable via computer-executable instructions to adjust the frequency spread of the modulated output signal. The machine-readable storage medium may include, but is not limited to, flash memory, optical disks, CD-ROMs, DVD ROMs, RAMs, EPROMs, EEPROMs, magnetic or optical cards, or other type of machine-readable storage media suitable for storing electronic or computer-executable instructions. For example, embodiments of the invention may be downloaded as a computer program which may be transferred from a remote computer (e.g., a server) to a requesting computer (e.g., a client) by way of data signals via a communication link (e.g., a modem or network connection).

While the invention has been described in conjunction with specific embodiments thereof, many alternatives, modifications and variations will be apparent to those of ordinary skill in the art in light of the foregoing description.

For example, the predetermined voltage $V_x$ that gets added by adders 216 and 217 in the slave cell 202 of FIG. 2 may be added in the chaotic generation circuit 212 with a single adder. In such an embodiment, the output 421 of FIG. 4B is input to a multiplexer (not shown in FIG. 4B) which is controlled by the phase locked signal of the master cell 201 of FIG. 2. If the master cell 201 of FIG. 2 is locked the multiplexer (not shown in FIG. 4B) selects the output 421. This output 421, via the multiplexer (not shown in FIG. 4B) is then summed with the predetermined voltage $V_x$ via an analog adder (also not shown in FIG. 4B). This analog adder, in one embodiment, replaces the adders 316 and 217 of FIG. 2. The final output of the chaotic signal generator 410, in such an embodiment, includes the predetermined voltage $V_x$.

In one embodiment, if the loop of the master cell 201 of FIG. 2 is not locked, the multiplexer (not shown in FIG. 4B) adds a zero voltage (ground) to the predetermined voltage $V_x$ via the analog adder (not shown in FIG. 4B) to generate the output of the chaotic signal generator 410. In such an embodiment, the output signal 421 of FIG. 4B is bypassed by the multiplexer (not shown in FIG. 4B) because the loop of the master cell 201 of FIG. 2 is not locked.

In one alternative embodiment, the SR latches 207 and 215 of FIG. 2 may be replaced with SR flip-flops. Similarly, in another alternative embodiment, the ramp generator may be implemented as FIG. 6C instead of the implementation shown in FIG. 6B.

The embodiments of the invention are intended to embrace all such alternatives, modifications, and variations as to fall within the broad scope of the appended claims.

We claim:

1. An apparatus comprising:
a master cell to generate a control voltage corresponding to an un-modulated reference signal, wherein the master cell comprises:
an edge generator to generate pulse signals;
a phase-frequency detector to receive the pulse signals and the un-modulated reference signal, and to generate an output; and
a loop filter, coupled with the phase-frequency detector, to convert the output to the control voltage; and
a slave cell having a chaotic signal generator to generate a random noise signal, the slave cell coupled with the master cell and operable to generate a modulated output signal in response to the control voltage.

2. The apparatus of claim 1, wherein the chaotic signal generator is operable to generate the random noise signal based on a chaotic transfer map.

3. The apparatus of claim 2, wherein the chaotic transfer map includes one of a tent transfer map and a Bernoulli shift map.

4. The apparatus of claim 1, wherein the master cell further comprises:

a ramp generator to generate a ramp signal corresponding to the control voltage; and
a comparator, coupled with the ramp generator, to compare the ramp signal with a predetermined voltage to generate control signals for the edge generator.

5. The apparatus of claim 4, wherein the predetermined voltage is set for generating the control signals having a frequency corresponding to the frequency of the un-modulated reference signal.

6. The apparatus of claim 4, wherein the ramp generator comprises:
a first charge pump;
a second charge pump; and
a multiplexer coupled with the first and the second charge pumps, the multiplexer operable to generate the ramp signal.

7. The apparatus of claim 1, wherein the slave cell further comprises:
a ramp generator to generate a ramp signal corresponding to the control voltage from the master cell;
an adder, coupled with the chaotic noise generator, to add a predetermined voltage to the random noise signal to generate a summed output;
a comparator, coupled with the chaotic noise generator, to compare the summed output with the ramp signal; and
an edge generator, coupled with the comparator, to generate the modulated output signal.

8. The apparatus of claim 7, wherein the predetermined voltage is set by the master cell to generate control signals for the edge generator, the control signals having a frequency corresponding to the frequency of the un-modulated reference signal.

9. The apparatus of claim 7, wherein the ramp generator comprises:
a first charge pump;
a second charge pump; and
a multiplexer, coupled with the first and the second charge pumps, to generate the ramp signal.

10. The apparatus of claim 1, wherein the chaotic signal generator comprises:
a first positive multiplier;
a negative multiplier;
a first multiplexer coupled with the positive multiplier and the negative multiplier;
a second multiplexer coupled with a second positive multiplier to multiply a bias voltage; and
a summing amplifier coupled with the first multiplexer and the second multiplexer, to generate the random noise signal.

11. The apparatus of claim 10, wherein the chaotic signal generator further comprises:
an analog flip-flop operable to sample the random noise signal; and
a comparator, coupled with the analog flip-flop, to generate a control signal for the first multiplexer and the second multiplexer.

12. The apparatus of claim 11, wherein the analog flip-flop is operable to sample the random noise signal at a programmable frequency.

13. The apparatus of claim 10, wherein the bias voltage is programmable to adjust the frequency spread of the modulated output signal.

14. A method comprising:
generating, by a master cell, a control voltage from an un-modulated reference signal, wherein the master cell comprises:
an edge generator to generate pulse signals;

a phase-frequency detector to receive the pulse signals and the un-modulated reference signal, and to generate an output; and a loop filter, coupled with the phase-frequency detector, to convert the output to the control voltage; and generating, by a slave cell having a chaotic signal generator operable to generate a random noise signal, a modulated output signal in response to the control voltage and the random noise signal, wherein the slave cell is coupled with the master cell.

15. The method of claim 14, wherein generating the random noise signal comprises implementing a chaotic transfer map.

16. An apparatus comprising:
means for generating a control voltage from an un-modulated reference signal;
means for generating a random noise signal based on a chaotic transfer map function;
means for generating a modulated output signal in response to the control voltage and the random noise signal;
means for generating a ramp signal corresponding to the control voltage;
means for adding a predetermined voltage to the random noise signal to generate a summed output; and
means for comparing the ramp signal with the summed output, wherein the modulated output signal is based on the comparing.

17. The apparatus of claim 16, wherein means for generating the ramp signal comprises:
means for adjusting slope of the ramp signal based on the control voltage;
means for discontinuing the ramp signal based on the comparing; and
means for triggering the ramp signal based on the comparing.

18. The apparatus of claim 16, wherein means for generating a random noise signal comprises means for implementing a chaotic transfer map.

19. The apparatus of claim 18, wherein the chaotic transfer map includes one of a tent transfer map and a Bernoulli shift map.

20. The apparatus of claim 16, wherein means for generating the random noise signal comprises:
means for positively multiplying a previous random noise signal by two;
means for negatively multiplying the previous random noise signal by two;
means for positively multiplying a bias voltage by four;
means for comparing the previous random noise signal with the bias voltage;
means for first multiplexing the previous random noise signal, which is multiplied positively by two, and the previous random noise signal, which is multiplied negatively by two;
means for second multiplexing the bias voltage, which is positively multiplied by four, and a ground signal; and
means for summing outputs from the first multiplexing and the second multiplexing to generate the random noise signal.

21. An apparatus comprising:
a first cell to generate a control voltage corresponding to an un-modulated reference signal; and
a second cell to generate a random noise signal, the second cell coupled with the first cell and operable to generate a modulated output signal in response to the control voltage, wherein the second cell comprises a ramp generator to generate a ramp signal corresponding to the control voltage from the first cell.

22. The apparatus of claim 21, wherein the second cell is operable to generate the random noise signal based on a chaotic transfer map.

23. The apparatus of claim 21, wherein the first cell comprises a phase-frequency detector to receive the pulse signals and the un-modulated reference signal, and to generate an output.

24. The apparatus of claim 23, wherein the first cell comprises a loop filter, coupled with the phase-frequency detector, to convert the output to the control voltage.

25. The apparatus of claim 21, wherein the second cell comprises:
an adder to add a predetermined voltage to the random noise signal to generate a summed output.

26. The apparatus of claim 25, wherein the second cell comprises a comparator to compare the summed output with the ramp signal.

27. The apparatus of claim 26, wherein the second cell comprises an edge generator, coupled with the comparator, to generate the modulated output signal.

28. The apparatus of claim 26, wherein the ramp generator comprises:
a first charge pump;
a second charge pump; and
a multiplexer, coupled with the first and the second charge pumps, to generate the ramp signal.

* * * * *